US009676219B2

(12) United States Patent
Cho et al.

(10) Patent No.: US 9,676,219 B2
(45) Date of Patent: Jun. 13, 2017

(54) HEAT TRANSFER FILM AND ORGANIC ELECTROLUMINESCENT ELEMENT MANUFACTURED USING SAME

(71) Applicant: CHEIL INDUSTRIES INC., Gumi-si, Gyeongsangbuk-do (KR)

(72) Inventors: Seong Heun Cho, Uiwang-si (KR); Kyoung Ku Kang, Uiwang-si (KR); Si Kyun Park, Uiwang-si (KR); Sung Han Kim, Uiwang-si (KR); Se Hyun Park, Uiwang-si (KR); Eun Su Lee, Uiwang-si (KR); Jung Hyo Lee, Uiwang-si (KR); Jin Hee Choi, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/758,168

(22) PCT Filed: Sep. 30, 2013

(86) PCT No.: PCT/KR2013/008757
§ 371 (c)(1),
(2) Date: Jun. 26, 2015

(87) PCT Pub. No.: WO2014/104542
PCT Pub. Date: Jul. 3, 2014

(65) Prior Publication Data
US 2015/0375551 A1 Dec. 31, 2015

(30) Foreign Application Priority Data

Dec. 27, 2012 (KR) .......................... 10-2012-0155608

(51) Int. Cl.
*B41M 5/382* (2006.01)
*H01L 51/00* (2006.01)
(Continued)

(52) U.S. Cl.
CPC .......... *B41M 5/46* (2013.01); *B41M 5/38207* (2013.01); *B41M 5/38214* (2013.01);
(Continued)

(58) Field of Classification Search
CPC .... B41M 5/382; B41M 5/38214; B41M 5/46; B41M 2205/30; B41M 2205/34;
(Continued)

(56) References Cited

U.S. PATENT DOCUMENTS 5,654,080 A 8/1997 Hayashi et al.
6,613,819 B2 * 9/2003 Johnson ................. B32B 27/18
428/480

FOREIGN PATENT DOCUMENTS

CN 1923530 A 3/2007
CN 101557942 A 10/2009
(Continued)

OTHER PUBLICATIONS

Taiwan Patent Office action dated Apr. 21, 2015, issued in Application No. TW 102147748, with partial English translation, 7 pages.
International Search Report dated Jan. 13, 2014, for Application No. PCT/KR2013/008757, 2 pages.
KIPO Office action dated Apr. 3, 2015, for priority application No. KR 10-2012-0155608, 4 pages.
SIPO Office action dated Mar. 2, 2016, issued in CN Application No. 201380068554.9, with partial English translation, 7 pages.
Taiwan Office action dated Jul. 7, 2016, corresponding to Taiwanese Patent Application No. 102147748 (6 pages).

*Primary Examiner* — Bruce H Hess
(74) *Attorney, Agent, or Firm* — Lewis Roca Rothgerber Christie LLP

(57) ABSTRACT

The present invention relates to a heat transfer film and an organic electroluminescent element manufactured using the same. More specifically, the present invention relates to: a heat transfer film comprising a base film and an outermost layer formed on the base film, wherein a ratio of an elastic modulus of the outermost layer to an elastic modulus of the base film at 25° C. and relative humidity of 45% is approximately 1 or more; and an organic electroluminescent element manufactured using the same.

19 Claims, 3 Drawing Sheets

(51) Int. Cl.
*H01L 51/50* (2006.01)
*B41M 5/46* (2006.01)
*B41M 5/42* (2006.01)

(52) U.S. Cl.
CPC ........... *B41M 5/42* (2013.01); *H01L 51/0013* (2013.01); *H01L 51/5012* (2013.01); *B41M 2205/30* (2013.01); *B41M 2205/34* (2013.01); *B41M 2205/36* (2013.01); *B41M 2205/38* (2013.01); *B41M 2205/40* (2013.01)

(58) Field of Classification Search
CPC .......... B41M 2205/36; B41M 2205/38; B41M 2205/40; H01L 51/00; H01L 51/0013; H01L 51/50; H01L 51/5012
USPC ................... 428/32.8, 32.81, 32.87, 212–218
See application file for complete search history.

(56) References Cited

FOREIGN PATENT DOCUMENTS

| | | |
|---|---|---|
| JP | 2000-062396 A | 2/2000 |
| JP | 2001-253178 A | 9/2001 |
| KR | 10-2007-0056847 A | 6/2007 |
| KR | 10-0731748 B1 | 6/2007 |
| KR | 10-2012-0138691 A | 12/2012 |
| TW | 201422551 A | 6/2014 |

\* cited by examiner

HEAT TRANSFER FILM AND ORGANIC ELECTROLUMINESCENT ELEMENT MANUFACTURED USING SAME

CROSS-REFERENCE TO RELATED APPLICATIONS(S)

This application is a National Stage of International Application No. PCT/KR2013/008757 filed Sep. 30, 2013, which claims priority to and the benefit of Korean Patent Application No. 10-2012-0155608, filed in the Korean Intellectual Property Office on Dec. 27, 2012, the entire contents of both of which are incorporated herein by reference.

TECHNICAL FIELD

The present invention relates to a thermal transfer film and an organic electroluminescent device prepared using the same.

BACKGROUND ART

A thermal transfer film may be used as a donor film upon formation of patterns. The thermal transfer film includes a light-to-heat conversion layer stacked on a base film. A transfer layer including an organic electroluminescent material and the like is stacked on the light-to-heat conversion layer. When the light-to-heat conversion layer is irradiated with light in an absorption wavelength range, the transfer layer can be transferred by the light-to-heat conversion layer. It is necessary for the light-to-heat conversion layer to maintain specific optical density for thermal transfer through light induction, and to have an externally uniform coating for uniform transfer.

In addition, an interlayer may be formed between the light-to-heat conversion layer and the transfer layer. Surface roughness of the interlayer may be an important factor capable of decreasing transfer failure of the transfer layer.

Generally, the base film for the thermal transfer film is a film having coating layer. To impart coatability to the base film, the surface of the base film may be treated with a primer (generally, particles) formed of a material, such as polyurethane, polyester, and the like.

Generally, the thermal transfer film may be prepared into a product through a process of winding the thermal transfer film around a roll. FIG. 3 shows (A) a stack of two thermal transfer films after winding a thermal transfer film 1 around a roll 2 and (B) a thermal transfer film separated therefrom, in a process of preparing the thermal transfer film 1. Referring to FIG. 3, (A) the stack of a first thermal transfer film, which includes a base film 10 having a primer 13 formed thereon, a light-to-heat conversion layer 11 and an interlayer 12, and a second thermal transfer film, which includes a base film 20 having a primer 23 formed thereon, a light-to-heat conversion layer 21 and an interlayer 22, is prepared by winding the thermal transfer film 1 around the roll 2. Here, indentations 14 having a shape of the primer can be formed on the interlayer 12 of the first thermal film due to the primer 23 the base film 20 of the second thermal transfer film by winding pressure of the roll 2.

The indentations 14 can provide poor surface roughness to the interlayer, thereby causing transfer failure of the transfer layer. Although the thermal transfer film including the base film, the light-to-heat conversion layer and the interlayer is illustrated in FIG. 3, the thermal transfer film including the base film and the light-to-heat conversion layer can also suffer from the indentations.

DISCLOSURE

Technical Problem

It is one aspect of the present invention to provide a thermal transfer film that prevents formation of indentations on the light-to-heat conversion layer or the interlayer due to a primer of a base film during winding the thermal transfer film around a roll, thereby preventing transfer failure.

It is another aspect of the present invention to provide an organic electroluminescent device manufactured using the thermal transfer film as a donor film.

Technical Solution

In accordance with one aspect of the present invention, a thermal transfer film may include: a base film; and an outermost layer formed on the base film, wherein a ratio of elastic modulus of the outermost layer to that of the base film is about 1 or more, at 25° C. and relative humidity 45%.

In accordance with another aspect of the present invention, an organic electroluminescent device may be prepared using the thermal transfer film as a donor film for laser transfer.

Advantageous Effects

The present invention provides a thermal transfer film that prevents formation of indentations on the light-to-heat conversion layer or the interlayer due to a primer of a base film during winding the thermal transfer film around a roll, thereby preventing transfer failure.

BEST MODE

Figure 1:
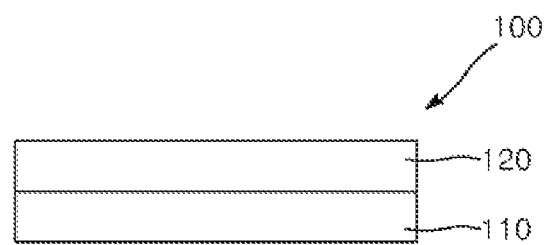
FIG. 1 is a cross-sectional view of a thermal transfer film according to one embodiment of the present invention.

Embodiments of the present invention will now be described in detail with reference to the accompanying drawings. It should be understood that the present invention is not limited to the following embodiments and may be embodied in different ways, and that the embodiments are given to provide thorough understanding of the invention to those skilled in the art. Descriptions of unrelated components will be omitted for clarity. Like components will be denoted by like reference numerals throughout the specification.

As used herein, terms such as "upper side" and "lower side" are defined with reference to the accompanying drawings. Thus, it will be understood that the term "upper side" can be used interchangeably with the term "lower side". It will be understood that when an element such as a layer, film, region or substrate is referred to as being placed "on" another element, it can be directly placed on the other element, or an intervening layer(s) may also be present. On the other hand, when an element is referred to as being "directly placed on" another element, an intervening layer(s) is not present. The term "(meth)acrylate" may refer to acrylates and/or methacrylates.

As used herein, the term "modulus" refers to elastic modulus, and may be measured on a surface of a base film, a light-to-heat conversion layer or an interlayer, respectively, at 25° C. and relative humidity 45%. For measurement of modulus, reference may be made to the following examples.

In accordance with one aspect of the present invention, a thermal transfer film can prevent formation of indentations on the light-to-heat conversion layer or the interlayer due to a primer of a base film during winding the thermal transfer film around a roll, by adjusting modulus of the light-to-heat conversion layer or interlayer to that of the base film. As a result, the thermal transfer film may maintain low surface roughness of the light-to-heat conversion layer or interlayer, on which a transfer layer will be stacked, thereby preventing transfer failure.

The thermal transfer film may include: a base film and an outermost layer formed on the base film, wherein the thermal transfer film may have a ratio of elastic modulus of the outermost layer to that of the base film of about 1 or more, at 25° C. and relative humidity 45%. If the ratio is less than 1, the light-to-heat conversion layer or the interlayer can suffer from formation of indentations due to the primer of the base film during winding of the thermal transfer film around the roll, and there can have transfer failure due to poor surface roughness of the light-to-heat conversion layer or interlayer, on which the transfer layer will be stacked.

Hereinafter, a thermal transfer film according to one embodiment of the present invention will be described in detail with reference to FIG. 1. FIG. 1 is a cross-sectional view of a thermal transfer film according to one embodiment of the present invention.

Referring to FIG. 1, a thermal transfer film according to one embodiment of the present invention 100 may include a base film 110 and a light-to-heat conversion layer 120 formed on the base film 110, wherein the light-to-heat conversion layer 120 is as an outermost layer of the thermal transfer film 100, and a ratio of elastic modulus of the light-to-heat conversion layer 120 to that of the base film 110 is about 1 or more. The light-to-heat conversion layer may have higher modulus than the base film, and thus can prevent formation of indentations due to a primer of the base film by winding pressure of a roll even when the thermal transfer film is wound around the roll. The ratio of modulus may be about 1.0 or more, for example about 1.1 to 2.5, for example about 1.1, 1.2, 1.3, 1.4, 1.5, 1.6, 1.7, 1.8, 1.9, 2.0, 2.1, 2.2, 2.3, 2.4 or 2.5. Thus, thermal transfer film can prevent formation of indentations due to a primer of the base film by winding pressure of a roll even when the thermal transfer film is wound around the roll.

The base film may exhibit good adhesion to the light-to-heat conversion layer, and may control temperature transfer between the light-to-heat conversion layer and the other layers. The base film may be a transparent polymer film, and may be a film formed with at least one of polyesters, polyacrylics, polyepoxys, polyolefins including polyethylenes, polypropylenes and the like, and polystyrenes, without being limited thereto. Preferably, the base film may be a polyester film including polyethyleneterephthalate (PET), polyethylenenaphthalate, or the like.

The base film may have a single layer, or multiple layers in which two or more layers are stacked.

The base film may have a thickness from about 10 μm to about 500 μm, preferably from about 50 μm to about 250 μm. Within this range, the base film can be used as a base film of the thermal transfer film.

The base film may have a modulus from about 2 GPa to about 9 GPa, preferably from about 3.5 GPa to about 7.5 GPa, more preferably about 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, 6.6, 6.7, 6.8, 6.9, 7.0, 7.1, 7.2, 7.3, 7.4 or 7.5 GPa. Within this range, the modulus of the light-to-heat conversion layer or interlayer can be easily adjusted so as to prevent formation of the indentations, thereby decreasing transfer failure due to the indentations.

The base film may have hardness from about 200 Mpa to about 1,000 Mpa, for example from about 300 Mpa to about 800 Mpa. Within this range, the base film can sufficiently support the light-to-heat conversion layer or the interlayer.

The base film may be coated, and may be treated with primer particles of a polyurethane or polyester material before the coating to improve coatability. As a result, the base film may have a surface roughness Rpv (difference in height between a minimum peak and a maximum peak, peak to valley) from about 100 nm to about 200 nm, preferably about 100, 120, 130, 140, 150, 160, 170, 180, 190, or 200 nm and a surface roughness Rq (mean square roughness) from about 3 nm to about 15 nm, preferably about 3, 4, 5, 6, 7, 8, 9, 10, 11, 12, 13, 14 or 15 nm. The term "surface roughness" of the base film may mean surface roughness of a primer-treated side of the base film.

The light-to-heat conversion layer may include a cured product of a composition for a light-to-heat conversion layer including a light-to-heat converting material and a binder, and the composition for a light-to-heat conversion layer may further include an initiator.

The light-to-heat converting material may include at least one of dyes, pigments, carbon black, and tungsten oxide, typically applicable to the light-to-heat conversion layer. Preferably, the light-to-heat converting material may include at least one of carbon black and tungsten oxide.

The light-to-heat converting material may be included in an amount of about 1 wt % to about 30 wt %, preferably about 10 wt % to about 20 wt %, more preferably about 10, 11, 12, 13, 14, 15, 16, 17, 18, 19 or 20 wt % in the light-to-heat conversion layer. Within this range, the light-to-heat conversion layer can exhibit good light-to-heat conversion efficiency and can improve transfer efficiency to reduce failure.

The binder may include a UV curable resin, a polyfunctional monomer, or a mixture thereof.

The UV curable resin may include at least one of (meth) acrylates, phenols, polyvinylbutyral, polyvinylacetate, polyvinylacetal, polyvinylidenechlorides, cellulose ether, cellulose ester, nitrocellulose, polycarbonate, polyalkyl (meth) acrylates including polymethylmethacrylate and the like, epoxy (meth)acrylates, epoxy, ester, ether, alkyd, spiroacetal, polybutadiene, polythiol polyene, (meth)acrylate resins of a polyfunctional compound of polyvalent alcohol and the like, and acrylics, without being limited thereto. Preferably, the UV curable resin may include epoxy (meth)acrylate and at least one of the above UV curable resins.

The UV curable resin may be included in an amount of about 50 wt % to about 80 wt %, preferably about 60 wt % to about 70 wt %, more preferably about 60, 61, 62, 63, 64, 65, 66, 67, 68, 69, or 70 wt % in the light-to-heat conversion layer.

The polyfunctional monomer may be a di- or higher functional monomer, preferably trifunctional to hexafunctional monomer. For example, the polyfunctional monomer may include at least one of polyfunctional (meth)acrylate monomers derived from hydroxyl groups of polyvalent alcohols and fluorine modified polyfunctional (meth)acrylate monomers. Specifically, the polyfunctional monomer may include at least one selected from polyfunctional (meth) acrylate monomers and fluorine modified polyfunctional (meth)acrylate monomers, without being limited thereto. The polyfunctional (meth)acrylate monomers may be selected from the group consisting of ethyleneglycoldi(meth)acrylate, diethyleneglycol di(meth)acrylate, triethyleneglycoldi(meth)acrylate, 1,4-butanedioldi(meth)acrylate, 1,6-hexanedioldi(meth)acrylate, neopentylglycoldi(meth) acrylate, pentaerythritol di(meth)acrylate, pentaerythritol tri (meth)acrylate, pentaerythritol tetra(meth)acrylate, dipentaerythritol di(meth)acrylate, dipentaerythritol tri(meth) acrylate, dipentaerythritol penta(meth)acrylate, dipentaerythritol hexa(meth)acrylate, bisphenol A di(meth) acrylate, trimethylolpropane tri(meth)acrylate, ditrimethylolpropane tri(meth)acrylate, ditrimethylolpropane tetra(meth)acrylate, and propyleneglycol di(meth)acrylate, without being limited thereto. The fluorine modified polyfunctional (meth)acrylate monomers may be prepared by fluorine modification of the polyfunctional (meth)acrylate monomers.

The polyfunctional monomer may be included in an amount of about 1 wt % to about 25 wt %, preferably about 10 wt % to about 25 wt %, more preferably about 10, 11, 12, 13, 14, 15, 16, 17, 18, 19, 20, 21, 22, 23, 24, 25 wt % in the light-to-heat conversion layer.

The binder may be included in an amount of about 60 wt % to about 90 wt %, preferably about 80 wt % to about 85 wt %, more preferably about 80, 81, 82, 83, 84, 85 wt % in the light-to-heat conversion layer. Within this range, a stable matrix of the light-to-heat conversion layer can be formed, and modulus capable of preventing formation of indentations can be easily realized.

The initiator may include a photo initiator typically used in the art. For example, the initiator may be a benzophenone compound such as 1-hydroxycyclohexylphenylketone, without being limited thereto.

The initiator may be included in an amount of about 1 wt % to about 20 wt %, preferably about 1 wt % to about 5 wt %, more preferably about 1, 2, 3, 4, 5 wt % in the light-to-heat conversion layer. Within this range, the light-to-heat conversion layer can exhibit sufficient hardness, and unreacted initiator may not remain as an impurity.

The composition for a light-to-heat conversion layer may further include a solvent. The solvent serves to form a preparation solution for the light-to-heat converting material, the binder and the like. The solvent may be any solvent capable of forming a light-to-heat conversion layer without limitation. Preferably, the solvent may include methylethylketone, propyleneglycolmonomethyletheracetate, or the like.

The composition for a light-to-heat conversion layer may be prepared by a typical method, and may be prepared by adding the initiator to the binder, followed by adding the light-to-heat converting material and mixing the components. The composition may include about 60 wt % to about 90 wt % of the binder, about 1 wt % to about 10 wt % of the initiator, and about 1 wt % to about 30 wt % of the light-to-heat converting material in terms of solid content. Within this range, the light-to-heat conversion layer capable of satisfying the ratio of modulus thereof to that of the base film can be realized.

In one embodiment, the composition for a light-to-heat conversion layer may include about 30 wt % to about 50 wt % of epoxy(meth)acrylate, about 10 wt % to about 30 wt % of polyalkyl(meth)acrylate, about 1 wt % to about 25 wt % of a polyfunctional monomer, about 1 wt % to about 20 wt % of the initiator, and about 1 wt % to about 30 wt % of the light-to-heat converting material in terms of solid content. Preferably, the composition may include about 35 wt % to about 45 wt % of epoxy(meth)acrylate, about 20 wt % to about 30 wt % of polyalkyl(meth)acrylate, about 10 wt % to about 20 wt % of the polyfunctional monomer, about 1 wt % to about 5 wt % of the initiator, and about 10 wt % to about 20 wt % of the light-to-heat converting material in terms of solid content.

The thermal transfer film may be prepared by a typical method. For example, the composition for a light-to-heat conversion layer is coated onto one surface of the base film and then dried, followed by curing the composition through UV irradiation at about 300 mJ/cm$^2$ to about 600 mJ/cm$^2$ in a nitrogen atmosphere, thereby preparing a thermal transfer film.

The light-to-heat conversion layer has a thickness from about 1 μm to about 10 μm, preferably from about 2 μm to about 4 μm. Within this range, the light-to-heat conversion layer can be applied to the thermal transfer film.

The light-to-heat conversion layer may have a modulus from about 3 GPa to about 10 GPa, preferably about 4 GPa to about 8 GPa more preferably about 4, 4.5, 5, 5.5, 6.0, 6.5, 7.0, 7.5, 8.0 GPa. Within this range, the thermal transfer film can prevent formation of indentations and can decrease transfer failure.

The light-to-heat conversion layer may have a hardness from about 200 Mpa to about 800 Mpa, preferably about 300 Mpa to about 550 Mpa. Within this range, the thermal transfer film can prevent formation of indentations and can decrease transfer failure.

The light-to-heat conversion layer may have a surface roughness Rpv from about 5 nm to about 36 nm, more preferably 30, 35, 35.5, 36 nm and a surface roughness Rq from about 0.1 nm to about 5 nm, more preferably about 0.1, 0.5, 1.0, 1.5, 2.0, 2.5, 3.0, 3.5, 4.0, 4.5, 5.0 nm. Within this range, the thermal transfer film can decrease transfer failure.

Figure 2:
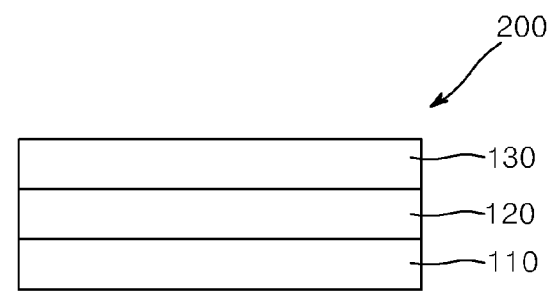
FIG. 2 is a cross-sectional view of a thermal transfer film according to another embodiment of the present invention.
Figure 3:
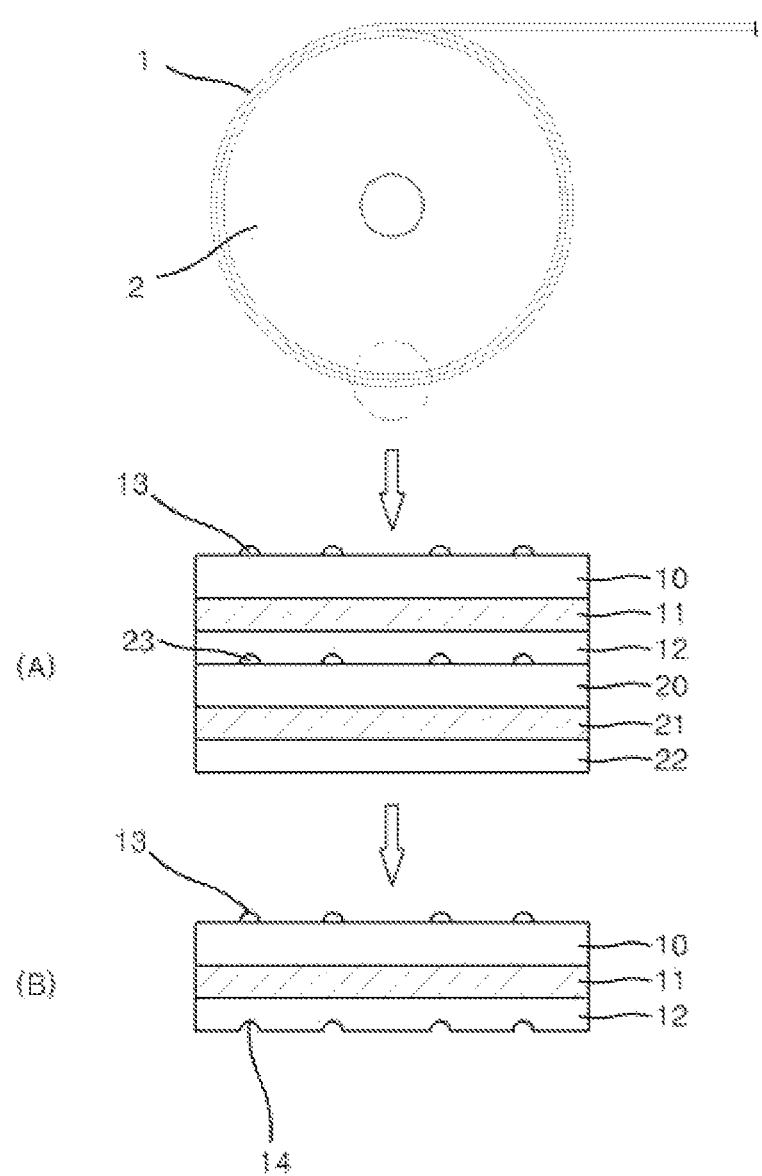
FIG. 3 shows indentations are occurred on a thermal transfer film due to a primer of a base film during winding of the thermal transfer film around a roll.

Hereinafter, a thermal transfer film according to another embodiment of the present invention will be described in detail with reference to FIG. 2. FIG. 2 is a cross-sectional view of a thermal transfer film according to another embodiment of the present invention.

Referring to FIG. 2, a thermal transfer film according to another embodiment of the present invention 200 may include a base film 110, a light-to-heat conversion layer 120 formed on the base film 110 and an interlayer 130 formed on the light-to-heat conversion layer 120. The thermal transfer film 200 is the same as the thermal transfer film according to one embodiment except that the interlayer 130 is formed on the light-to-heat conversion layer 120. Thus, only the interlayer will be described in detail hereinafter.

The interlayer 130 is an outermost layer of the thermal transfer film 200, and the thermal transfer film 200 may have a ratio of modulus of the interlayer 130 to that of the base film 110 of about 1 or more, preferably about 1.1 to about 2.5, more preferably about 1.1 to about 2.2. Since the interlayer has higher modulus than the base film, the thermal transfer film can prevent formation of indentations due to a primer of the base film by winding pressure of a roll even when the thermal transfer film is wound around the roll.

Details of the base film and the light-to-heat conversion layer are the same as described above.

The light-to-heat conversion layer 120 may have a modulus from about 3 GPa to about 10 GPa, preferably about 4 GPa to about 8 GPa. Within this range, the thermal transfer film can prevent formation of indentations due to the primer of the base film and can decrease transfer failure.

The light-to-heat conversion layer may have a hardness from about 200 Mpa to about 800 Mpa, preferably about 300 Mpa to about 550 Mpa. Within this range, the thermal transfer film can prevent formation of indentations and can decrease transfer failure.

The interlayer may be used to minimize damage and contamination of a transfer material of a transfer layer, and may reduce distortion of the transfer material of the transfer layer. In addition, the interlayer may improve adhesion of the transfer layer to the light-to-heat conversion layer, and control release of a portion of the transfer film, which may or not may include a pattern to be transferred to a receptor.

The interlayer may be formed of a composition including a UV curable resin, a polyfunctional monomer, a UV curable fluorine based compound, and a photo initiator.

The UV curable resin may form a matrix of the interlayer and prevent formation of indentations on the thermal transfer film by controlling the modulus of the interlayer.

The UV curable resin may include a polyfunctional resin, for example, a di- or higher-functional non fluorine based resin, to improve the modulus of the interlayer. Specifically, the UV curable resin may include at least one of epoxy (meth)acrylates including epoxy novolac (meth)acrylates and the like, urethane (meth)acrylates, (meth)acrylates, phenols, polyvinyl butyral resins, polyvinyl acetate, polyvinylacetal, polyvinylidenechlorides, cellulose ethers, cellulose esters, nitrocelluloses, polycarbonates, polyalkyl(meth)acrylates including polymethyl methacrylate and the like, epoxy(meth)acrylates, epoxys, esters, ethers, alkyds, spiroacetals, polybutadienes, polythiolpolyenes, (meth)acrylate resins of polyfunctional compounds such as polyvalent alcohols, and acrylic resins, without being limited thereto.

Preferably, the UV curable resin may include a di- or higher-functional epoxy novolac (meth)acrylates, a mixture of the di- or higher-functional epoxy novolac (meth)acrylates and a di- or higher-functional urethane (meth)acrylates, or a tri- or higher-functional urethane (meth)acrylates. The term di- or higher-functional may mean difunctional to pentafunctional, and the term tri- or higher-functional may mean trifunctional to pentafunctional.

A weight ratio of the di- or higher-functional epoxy novolac (meth)acrylates:the di- or higher-functional urethane (meth)acrylates may be about 1:0.5 to about 1:2.0, in the mixture of the di- or higher-functional epoxy novolac (meth)acrylates and a di- or higher-functional urethane (meth)acrylates. Within this range, the thermal transfer film can have a desired modulus to prevent formation of indentations, and can decrease transfer failure due to the indentations. Preferably, the weight ratio ranges from about 1:0.5 to about 1:1.5, more preferably from about 1:0.9 to about 1:1.1.

The UV curable resin may be included in an amount of about 50 wt % to about 80 wt %, preferably about 60 wt % to about 70 wt %, more preferably about 60, 61, 62, 63, 64, 65, 66, 67, 68, 69, 70 wt % in the interlayer in terms of solid content. Within this range, the modulus of the thermal transfer can be easily adjusted to prevent formation of indentations and decrease transfer failure due to indentations.

The polyfunctional monomer may be a di- or higher-functional, preferably trifunctional to hexafunctional, non fluorine based monomer, and may be a polyfunctional (meth)acrylate derived from hydroxyl groups of a polyvalent alcohol. For example, the polyfunctional monomer may include at least one of ethyleneglycoldi(meth)acrylate, propyleneglycol di(meth)acrylate, diethyleneglycol di(meth)acrylate, triethyleneglycoldi(meth)acrylate, 1,4-butanedioldi(meth)acrylate, 1,6-hexanedioldi(meth)acrylate, neopentylglycoldi(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta (meth)acrylate, dipentaerythritol hexa(meth)acrylate, bisphenol A di(meth)acrylate, trimethylolpropane tri(meth)acrylate, ditrimethylolpropane tri(meth)acrylate, and ditrimethylolpropane tetra(meth)acrylate.

The polyfunctional monomer may be included in an amount of about 10 wt % to about 40 wt %, preferably about 20 wt % to about 30 wt %, more preferably about 20, 21, 22, 23, 24, 25, 26, 27, 28, 29, 30 wt % in the interlayer in terms of solid content. Within this range, the modulus of the thermal transfer film can be easily adjusted to prevent formation of indentations and decrease transfer failure due to indentations.

The UV curable fluorine based compound may include a compound represented by Formula 1:

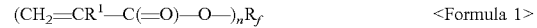

$(CH_2=CR^1-C(=O)-O-)_n R_f$ <Formula 1>

(wherein Formula 1, n is an integer of 1 or more, $R^1$ is a hydrogen atom or a $C_1$ to $C_5$ linear or branched alkyl group, and $R_f$ is a fluoroalkyl group or a fluoroalkylene group).

In one embodiment, $R_f$ may have any one structure of $C_1$ to $C_{10}$ perfluoroalkyl groups and (a) to (e) represented by Formula 2:

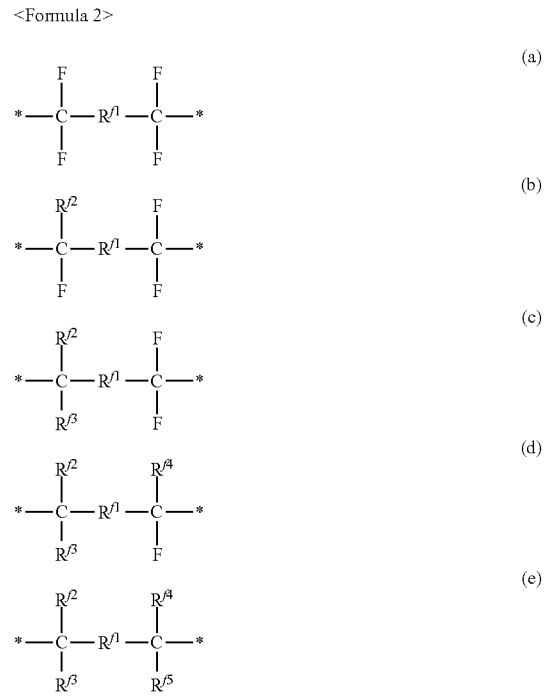

(wherein Formula 2, * is bonding site, le $R^{f1}$ is a $C_1$ to $C_{20}$ linear or branched alkylene group or a $C_1$ to $C_{20}$ linear or branched perfluoroalkylene group, $R^{f2}$, $R^{f3}$, $R^{f4}$, and $R^{f5}$ are hydrogen, a $C_1$ to $C_{20}$ linear or branched fluoroalkyl group, or a $C_1$ to $C_{20}$ linear or branched perfluoroalkyl group).

The UV curable fluorine based compound does not include a compound wherein in Formula 2, $R^{f1}$ is a $C_1$ to $C_{20}$ linear or branched alkylene group, and each of $R^{f2}$, $R^{f3}$, $R^{f4}$, and $R^{f5}$ is hydrogen.

Preferably, n is an integer of 2 or more, more preferably an integer from 2 to 20.

For example, the UV curable fluorine based compound may be 1H,1H,10H,10H-perfluoro-1,10-decanediol di(meth)acrylate.

The UV curable fluorine based compound may be included in an amount of about 1 wt % to about 10 wt %, preferably about 1 wt % to about 5 wt %, more preferably about 1, 2, 3, 4, 5 wt % in the interlayer in terms of solid content. Within this range, the thermal transfer film can easily transfer an organic light emitting material.

The initiator may be the same as described above. The initiator may be included in an amount of about 1 wt % to about 10 wt %, preferably about 1 wt % to about 5 wt %, more preferably about 1, 2, 3, 4, 5 wt % in the interlayer in terms of solid content. Within this range, the initiator can permit sufficient curing reaction, and adjust surface modulus of the interlayer.

The interlayer may be formed of a composition including about 50 wt % to about 80 wt % of the UV curable resin, about 10 wt % to about 40 wt % of the polyfunctional monomer, about 1 wt % to about 10 wt % of the UV curable fluorine compound, and about 1 wt % to about 10 wt % of the initiator in terms of solid content.

In one embodiment, the interlayer may be formed of a composition including about 60 wt % to about 70 wt % of epoxy novolac (meth)acrylate, about 20 wt % to about 30 wt % of the polyfunctional monomer, about 1 wt % to about 10 wt % of the UV curable fluorine based compound, and about 1 wt % to about 10 wt % of the initiator in terms of solid content. Preferably, the interlayer may be formed of a composition including about 65 wt % to about 70 wt % of epoxy novolac (meth)acrylate, about 25 wt % to about 30 wt % of the polyfunctional monomer, about 1 wt % to about 5 wt % of the UV curable fluorine based compound, and about 1 wt % to about 5 wt % of the initiator in terms of solid content.

In another embodiment, the interlayer may be formed of a composition including about 30 wt % to about 35 wt % of epoxy novolac (meth)acrylate, about 30 wt % to about 35 wt % of the di- or higher-functional urethane (meth)acrylate, about 20 wt % to about 30 wt % of the polyfunctional monomer, about 1 wt % to about 10 wt % of the UV curable fluorine based compound, and about 1 wt % to about 10 wt % of the initiator in terms of solid content. Preferably, the interlayer may be formed of a composition including about 30 wt % to about 35 wt % of epoxy novolac (meth)acrylate, about 30 wt % to about 35 wt % of di- or higher-functional urethane (meth)acrylate, about 25 wt % to about 30 wt % of the polyfunctional monomer, about 1 wt % to about 5 wt % of the UV curable fluorine based compound, and about 1 wt % to about 5 wt % of the initiator in terms of solid content.

The interlayer may have a thickness from about 1 µm to about 10 µm, preferably from about 2 µm to about 5 µm. Within this range, the interlayer can be used as an interlayer of the thermal transfer film.

The interlayer may have a modulus of about 3 GPa or more, preferably from about 3 GPa to about 10 GPa, more preferably from about 4 GPa to about 10 GPa. Within this range, the thermal transfer film can prevent formation of indentations and can decrease transfer failure due to the indentations.

The interlayer may have a hardness from about 200 Mpa to about 800 Mpa, preferably from about 300 Mpa to about 550 Mpa. Within this range, the thermal transfer film can prevent formation of indentations and can decrease transfer failure.

The interlayer may have a surface roughness Rpv from about 5 nm to about 36 nm, and a surface roughness Rq from about 0.1 nm to about 5 nm, preferably about 0.1, 0.5, 1.0, 1.5, 2.0, 2.5, 3.0, 3.5, 4.0, 4.5, 5.0 nm. Within this range, the thermal transfer film can decrease transfer failure.

The composition for the interlayer may further include a solvent. The solvent may be any solvent for formation of a light-to-heat conversion layer without limitation. Preferably, the solvent may include methylethylketone, propylene glycolmonomethyletheracetate.

The thermal transfer film may be used as a donor film for OLEDs and as a donor film for laser transfer, without being limited thereto. When the thermal transfer film is used as a donor film for laser transfer in an organic electroluminescent device formed of an organic material, the thermal transfer film may prevent transfer failure.

The thermal transfer film may have a transfer layer stacked on the light-to-heat conversion layer or the interlayer, which is the outermost layer in the thermal transfer film.

The transfer layer may include a transfer material, such as organic electroluminescent EL materials and the like. When the thermal transfer film is irradiated with a laser beam at a specific wavelength while the transfer layer adjoins a receptor having a specific pattern, the light-to-heat conversion layer expands to generate heat through absorption of light, whereby the transfer material of the transfer layer is thermally transferred to the receptor corresponding to the pattern.

The transfer layer may include at least one layer to transfer the transfer material to the receptor. The at least one layer may be formed of organic, inorganic, organometallic and other materials, which include electroluminescent or electrically active materials.

The transfer layer may be uniformly coated by evaporation, sputtering or solvent coating, or may be printed as a pattern by digital printing, lithography printing or evaporation, or sputtering through a mask, to be formed on the light-to-heat conversion layer.

In accordance with another aspect of the invention, an organic electroluminescent device (including an OLED) may be prepared using the thermal transfer film. Specifically, a donor film is disposed on a substrate on which a transparent electrode layer is formed. The donor film is a film in which the base layer, the light-to-heat conversion layer and the transfer layer are stacked, as described above. The donor film is irradiated with an energy source. The energy source passes through the base layer via a transfer apparatus to activate the light-to-heat conversion layer, which in turn emits heat through pyrolysis. The transfer layer is separated from the donor film due to expansion of the light-to-heat conversion layer in the donor film by the emitted heat, whereby a light emitting layer, which is the transfer material, is transferred to a desired thickness and pattern onto a pixel domain defined by a pixel defining layer on a substrate of the organic electroluminescent device.

MODE FOR INVENTION

Next, the present invention will be described in more detail with reference to some examples. However, it should be noted that these examples are provided for illustration only and are not to be construed in any way as limiting the present invention.

Preparative Example 1

Composition 1 for Light-to-Heat Conversion Layer 25 g of polymethylmethacrylate and 40 g of epoxyacrylate as a UV curable resin, 17 g of a trifunctional acrylate monomer (SR351, Sartomer Co., Ltd.) as a polyfunctional monomer, and 3 g of Irgacure 184 (BASF Co., Ltd.) as a photo initiator were mixed, thereby preparing a binder mixture. 15 g of carbon black was added to the binder mixture, followed by mixing the components for 30 minutes, thereby preparing a composition.

Preparative Example 2

Composition 2 for Light-to-Heat Conversion Layer 25 g of polymethylmethacrylate and 40 g of urethaneacrylate as a UV curable resin, 17 g of a trifunctional acrylate monomer (SR351, Sartomer Co., Ltd.) as a polyfunctional monomer, and 3 g of Irgacure 184 (BASF Co., Ltd.) as a photo initiator were mixed, thereby preparing a binder mixture. 15 g of carbon black was added to the binder mixture, followed by mixing the components for 30 minutes, thereby preparing a composition.

Preparative Example 3

Composition 1 for Interlayer 17.99 g of difunctional epoxy novolac acrylate (CN112C60, Sartomer Co., Ltd.) as a UV curable resin, 7.44 g of a trifunctional acrylate monomer (SR351, Sartomer Co., Ltd.) as a polyfunctional monomer, and 0.62 g of 1H,1H,10H,10H-perfluoro-1,10-decanediol diacrylate (Exfuluor Research Co., Ltd.) as a UV curable fluorine based compound were added to a mixture of 47.15 g of methylethylketone (MEK) and 26.05 g of propyleneglycolmonomethyletheracetate, followed by stirring for 30 minutes. 0.75 g of Irgacure 184 (BASF Co., Ltd.) as a photo initiator was added to the mixture, followed by stirring the components for 30 minutes, thereby preparing a composition.

Preparative Example 4

Composition 2 for Interlayer 17.99 g of a difunctional urethane acrylate oligomer (CN986, Sartomer Co., Ltd.) as a UV curable resin, 7.44 g of a trifunctional acrylate monomer (SR351, Sartomer Co., Ltd.) as a polyfunctional monomer, and 0.62 g of 1H,1H,10H,10H-perfluoro-1,10-decanediol diacrylate (Exfuluor Research Co., Ltd.) as a UV curable fluorine based compound were added to a mixture of 47.15 g of methylethylketone (MEK) and 26.05 g of propyleneglycolmonomethyletheracetate, followed by stirring for 30 minutes. 0.75 g of Irgacure 184 (BASF Co., Ltd.) as a photopolymerization initiator was added to the mixture, followed by stirring the components for 30 minutes, thereby preparing a composition.

Details of components used in the following Examples and Comparative Examples were as follows:

(1) Base film: A polyethylene terephthalate film (A1598, thickness: 100 μm)

(2) Light-to-heat conversion layer: Compositions of Preparative Examples 1 and 2

(3) Interlayer: Compositions of Preparative Examples 3 and 4.

Example 1

The Composition for a Light-to-Heat Conversion Layer of Preparative Example 1 was coated onto the base film using an applicator, followed by drying the composition in an oven at 80° C. for 2 minutes, thereby forming a coating layer. The composition of Preparative Example 3 was coated onto the coating layer, and then dried in an oven at 80° C. for 2 minutes, followed by curing through UV irradiation at 300 mJ/cm$^2$ in a nitrogen atmosphere, thereby preparing a thermal transfer film including a 3 μm thick light-to-heat conversion layer and a 3 μm thick interlayer.

Example 2

A thermal transfer film was prepared in the same manner as in Example 1 except that a mixture of the composition of Preparative Example 3 and the composition of Preparative Example 4 (weight ratio of 50:50, that is, 1:1) was coated instead of the composition of Preparative Example 3.

Example 3

The composition for a light-to-heat conversion layer of Preparative Example 1 was coated onto the base film using an applicator, followed by drying the composition in an oven at 80° C. for 2 minutes. Then, the composition was cured by UV irradiation at 300 mJ/cm$^2$ in a nitrogen atmosphere, thereby preparing a thermal transfer film including a 3 μm-thick light-to-heat conversion layer.

Comparative Example 1

A thermal transfer film was prepared in the same manner as in Example 1 except that the composition of Preparative Example 4 was coated instead of the composition of Preparative Example 3.

Comparative Example 2

A thermal transfer film was prepared in the same manner as in Example 3 except that the composition for a light-to-heat conversion layer of Preparative Example 2 was coated instead of the composition of Preparative Example 1.

The thermal transfer films prepared in Examples and Comparative Examples were evaluated as to whether indentations were formed due to a primer of the base film. First, modulus of each of the base film, the light-to-heat conversion layer and the interlayer was evaluated. Modulus was measured at 25° C. and relative humidity 45% using a NanoIndenter (Hysitron TI750 Ubi) under the conditions that an experiment mode was an indentation mode, a tip was a Berkovitz tip, a feedback mode was a force control mode, and a maximum force was fixed to 100 μN, and in a manner in which a specimen was loaded for 5 seconds and then maintained for 2 seconds, followed by unloading for 5 seconds. In this way, modulus and hardness of each of the base film, the light-to-heat conversion layer and the interlayer was measured. Measurement results are shown in Table 1.

Figure 4:
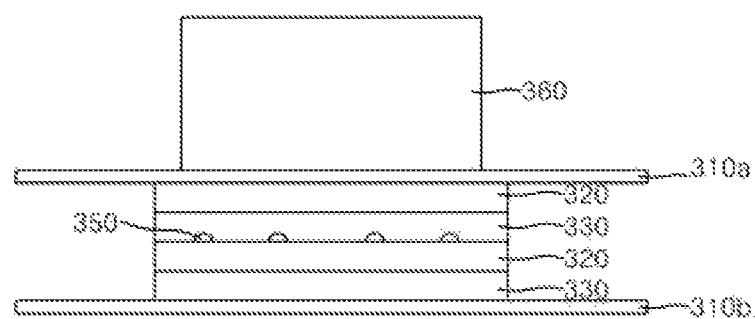
FIG. 4 is a cross-sectional view of a sample of one example for measuring indentations due to a primer.
Figure 5:
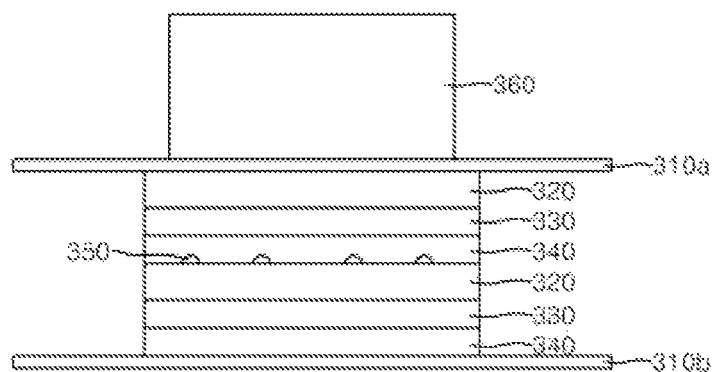
FIG. 5 is a cross-sectional view of a sample of another example for measuring indentations due to a primer.

Each of the thermal transfer films prepared in Examples and Comparative Examples was placed as shown in FIG. 4 or 5, and was evaluated as to whether indentations were formed due to the primer.

As shown in FIG. 4 or 5, two thermal transfer films (10 cm×10 cm, width×length) (a thermal transfer film in which a light-to-heat conversion layer 330 is stacked on a base film 320 with a primer 350, and a thermal transfer film in which a light-to-heat conversion layer 330 and an interlayer 340 are stacked on a base film 320 with a primer 350 in order) were stacked between glass plates 310a, 310b, and then pressed by a weight 360 of 1 kg. After the thermal transfer films were left in an oven at 50° C. for 24 hours, surface roughness of the light-to-heat conversion layer or interlayer was measured using an Atomic Force Microscope (XE-100, Park systems Co., Ltd., Korea). After a sample was cut at a position to be analyzed, and then attached onto a sample mount onto which a carbon tape was attached, a contact Mode or a non-Contact Mode was set to a head mode, and PSPD Display Window: A+B was set to 1 V, and A-B was set to −500 mV~+500 mV to measure surface roughness.

TABLE 1

| | | Example 1 | Example 2 | Example 3 | Comparative Example 1 | Comparative Example 2 |
|---|---|---|---|---|---|---|
| Modulus of base film (GPa) | | 3.89 | 3.89 | 3.89 | 3.89 | 3.89 |
| Surface roughness of base film (nm) | Rqv | 190.396 | 190.396 | 190.396 | 190.396 | 190.396 |
| | Rq | 12.742 | 12.742 | 12.742 | 12.742 | 12.742 |
| Hardness of base film (Mpa) | | 328.19 | 328.19 | 328.19 | 328.19 | 328.19 |
| Modulus of light-to-heat conversion layer (GPa) | | — | — | 4.82 | — | 2.56 |
| Hardness of light-to-heat conversion layer (Mpa) | | — | — | 305.06 | — | 130.85 |
| Modulus of interlayer (GPa) | | 8.23 | 4.52 | — | 2.78 | — |
| Hardness of interlayer (Mpa) | | 493.24 | 367.2 | — | 164.2 | — |
| Ratio of modulus of light-to-heat conversion layer to modulus of base film | | — | — | 1.24 | — | 0.66 |
| Ratio of modulus of interlayer to modulus of base film | | 2.11 | 1.16 | — | 0.71 | — |
| Surface roughness of light-to-heat conversion layer (nm) | Rpv | — | — | 35.351 | — | 170.216 |
| | Rq | — | — | 2.051 | — | 10.674 |
| Surface roughness of interlayer (nm) | Rpv | 33.005 | 35.233 | — | 162.426 | — |
| | Rq | 1.397 | 2.057 | — | 10.342 | — |

As shown in Table 1, the thermal transfer films according to the invention could prevent transfer failure upon transfer of the transfer layer by increasing the modulus of the interlayer or light-to-heat conversion layer above the modulus of the base film to achieve significant reduction of surface roughness of the light-to-heat conversion layer or interlayer contacting the base film having the primer thereon.

Conversely, the thermal transfer films according to Comparative Examples 1 and 2, in which the interlayer or light-to-heat conversion layer has a lower modulus than the base film, had much higher surface roughness than the thermal transfer films according to the invention, and thus could not realize advantageous effects of the invention.

Although the present invention has been described with reference to some embodiments in conjunction with the accompanying drawings, it should be understood that the foregoing embodiments are provided for illustration only and are not to be in any way construed as limiting the present invention, and that various modifications, changes, alterations, and equivalent embodiments can be made by those skilled in the art without departing from the spirit and scope of the invention.

The invention claimed is:

1. A thermal transfer film comprising:
   a base film; and
   a light-to-heat conversion layer formed on the base film,
   wherein a ratio of elastic modulus of the light-to-heat conversion layer to elastic modulus of the base film is about 1 or more, at 25° C. and relative humidity 45%.

2. The thermal transfer film according to claim 1, wherein the base film has an elastic modulus from about 2 GPa to about 9 GPa.

3. The thermal transfer film according to claim 1, wherein the base film has a surface roughness Rpv from about 100 nm to about 200 nm.

4. The thermal transfer film according to claim 1, wherein the base film comprises a film formed of at least one of polyesters, polyacrylics, polyepoxys, polyolefins, and polystyrenes.

5. The thermal transfer film according to claim 1, wherein the light-to-heat conversion layer has an elastic modulus from about 3 GPa to about 10 GPa.

6. The thermal transfer film according to claim 1, wherein the light-to-heat conversion layer is a cured product of a composition comprising: (A) a light-to-heat converting material; (B) a UV curable resin comprising at least one of polyalkyl (meth)acrylates and epoxy(meth)acrylates; (C) a trifunctional to hexafunctional (meth)acrylate monomer; and (D) an initiator.

7. The thermal transfer film according to claim 6, wherein the composition comprises: about 1 wt % to about 30 wt % of the (A), about 50 wt % to about 80 wt % of the (B), about 1 wt % to about 25 wt % of the (C), and about 1 wt % to about 20 wt % of the (D), in terms of solid content.

8. The thermal transfer film according to claim 1, further comprising: an outer layer on the light-to-heat conversion layer.

9. The thermal transfer film according to claim 1, further comprising an outer layer, wherein the light-to-heat conversion layer is stacked between the base film and the outer layer, and a ratio of elastic modulus of the outer layer to elastic modulus of the base film is about 1 or more at 25° C. and relative humidity 45%.

10. The thermal transfer film according to claim 9, wherein the base film has an elastic modulus from about 2 GPa to about 9 GPa.

11. The thermal transfer film according to claim 9, wherein the base film comprises a film formed of at least one of polyesters, polyacrylics, polyepoxys, polyolefins, and polystyrenes.

12. The thermal transfer film according to claim 9, wherein the outer layer has an elastic modulus from about 3 GPa to about 10 GPa.

13. The thermal transfer film according to claim 9, wherein the outer layer has a hardness from about 300 Mpa to about 550 Mpa.

14. The thermal transfer film according to claim 9, wherein the outer layer is a cured product of a composition comprising: (A) a UV curable resin; (B) a polyfunctional (meth)acrylate monomer; (C) a UV curable fluorine based compound; and (D) an initiator.

15. The thermal transfer film according to claim 14, wherein the UV curable resin comprises at least one of a di- or higher-functional epoxy (meth)acrylate, a mixture of the di- or higher-functional epoxy (meth)acrylate and a di- or higher-functional urethane (meth)acrylate, and a tri- or higher-functional urethane (meth)acrylate.

16. The thermal transfer film according to claim 14, wherein the UV curable fluorine based compound comprises a compound represented by Formula 1:

$$(CH_2=CR^1-C(=O)-O-)_n R_f \qquad \text{<Formula 1>}$$

(wherein in Formula 1, n is an integer of 1 or more, $R^1$ is a hydrogen atom or a $C_1$ to $C_5$ linear or branched alkyl group, and $R_f$ is a fluoroalkyl group or a fluoroalkylene group).

17. The thermal transfer film according to claim 16, wherein n is an integer from 2 to 20, and $R^f$ has any one structure of (a) to (e) represented by Formula 2:

<Formula 2>

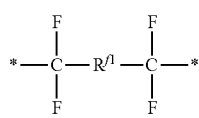
(a)

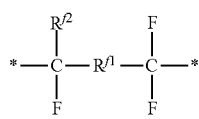
(b)

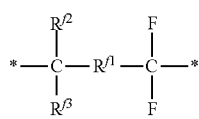
(c)

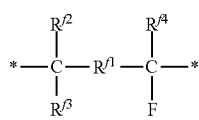
(d)

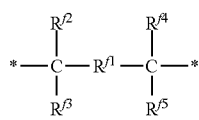
(e)

(wherein in Formula 2, * is bonding site, $R^{f1}$ is a $C_1$ to $C_{10}$ linear or branched perfluoroalkylene group, and $R^{f2}$, $R^{f3}$, $R^{f4}$, and $R^{f5}$ are hydrogen, or a $C_1$ to $C_{14}$ linear or branched perfluoroalkyl group).

18. The thermal transfer film according to claim 14, wherein the composition comprises: about 50 wt % to about 80 wt % of the (A), about 10 wt % to about 40 wt % of the (B), about 1 wt % to about 10 wt % of the (C), and about 1 wt % to about 10 wt % of the (D), in terms of solid content.

19. An organic electroluminescent device prepared using the thermal transfer film according to claim 1 as a donor film.

* * * * *